United States Patent
Kim

(10) Patent No.: US 10,915,259 B2
(45) Date of Patent: Feb. 9, 2021

(54) MEMORY DEVICE, MEMORY CONTROLLER AND MEMORY SYSTEM INCLUDING THEM, AND METHOD FOR OPERATING THEM FOR MATCHING OPERATION MODE OF MEMORY INTERFACES

(71) Applicant: SK hynix Inc., Gyeonggi-do (KR)

(72) Inventor: Jee-Yul Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 29 days.

(21) Appl. No.: 16/169,203

(22) Filed: Oct. 24, 2018

(65) Prior Publication Data
US 2019/0265900 A1 Aug. 29, 2019

(30) Foreign Application Priority Data
Feb. 27, 2018 (KR) .................. 10-2018-0023715

(51) Int. Cl.
| | |
|---|---|
| G06F 3/06 | (2006.01) |
| G06F 11/14 | (2006.01) |
| G06F 12/02 | (2006.01) |
| G11C 7/10 | (2006.01) |
| G11C 15/04 | (2006.01) |
| G11C 7/20 | (2006.01) |

(52) U.S. Cl.
CPC ............ *G06F 3/0634* (2013.01); *G06F 3/061* (2013.01); *G06F 3/064* (2013.01); *G06F 3/0679* (2013.01); *G06F 11/1441* (2013.01); *G06F 12/0246* (2013.01); *G11C 7/1045* (2013.01); *G11C 7/1063* (2013.01); *G11C 7/20* (2013.01); *G11C 15/046* (2013.01); *G11C 2207/2227* (2013.01)

(58) Field of Classification Search
CPC .... G06F 3/0634; G06F 3/061; G06F 12/0246; G06F 11/1441; G06F 3/0679; G06F 3/064; G06F 3/0688; G06F 13/1673; G11C 7/1063; G11C 7/20; G11C 15/046; G11C 7/1045; G11C 2207/2227; G11C 2029/0411; G11C 29/76; G11C 29/44
USPC ......... 711/103, 108, 170; 365/233.1, 233.13, 365/189.2; 713/2, 100
See application file for complete search history.

(56) References Cited

U.S. PATENT DOCUMENTS

| | | | |
|---|---|---|---|
| 6,505,282 B1 * | 1/2003 | Langendorf | ........ G06F 12/0684 365/189.15 |
| 7,103,742 B1 * | 9/2006 | Mailloux | ............. G11C 7/1024 365/189.18 |

(Continued)

FOREIGN PATENT DOCUMENTS

KR 101107152 2/2012

*Primary Examiner* — Hong C Kim
(74) *Attorney, Agent, or Firm* — IP & T Group LLP

(57) ABSTRACT

A memory system may include: a memory device storing data and including a memory interface in communication with a memory controller; and the memory controller controlling the memory device and including a controller interface in communication with the memory device, and, wherein, when the memory device is inaccessible, the memory controller requests a current state information including current operation mode of the memory interface from the memory device, and changes an operation mode of the controller interface to match the current operation mode of the memory interface according to the current state information received from the memory device.

19 Claims, 12 Drawing Sheets

(56) References Cited

U.S. PATENT DOCUMENTS

| | | | |
|---|---|---|---|
| 2003/0103407 A1* | 6/2003 | Ooishi | G11C 7/1045 |
| | | | 365/233.12 |
| 2004/0085832 A1* | 5/2004 | Kanda | G11C 7/1021 |
| | | | 365/200 |
| 2009/0059708 A1* | 3/2009 | Ko | G11C 8/12 |
| | | | 365/230.03 |
| 2012/0246389 A1* | 9/2012 | Nagashima | G11C 7/1045 |
| | | | 711/103 |
| 2014/0071744 A1* | 3/2014 | Lee | G11C 11/1653 |
| | | | 365/158 |
| 2016/0005482 A1* | 1/2016 | Lee | G11C 7/1051 |
| | | | 365/185.12 |
| 2016/0365127 A1* | 12/2016 | Chun | G11C 7/20 |
| 2018/0181346 A1* | 6/2018 | Kim | G06F 3/0659 |

\* cited by examiner

FIG. 6

| 7 | 6 | 5 | 4 | 3 | 2 | 1 | 0 |
|---|---|---|---|---|---|---|---|
| reserved | | | | | need NAND reset<br>0:no need<br>1:need | need CAM read<br>0:no need<br>1:need | data interface<br>0:SDR<br>1:DDR |

MEMORY DEVICE, MEMORY CONTROLLER AND MEMORY SYSTEM INCLUDING THEM, AND METHOD FOR OPERATING THEM FOR MATCHING OPERATION MODE OF MEMORY INTERFACES

CROSS-REFERENCE TO RELATED APPLICATION

This application claims priority under 35 U.S.C. § 119 to Korean Patent Application No. 10-2018-0023715, filed on Feb. 27, 2018, which is incorporated herein by reference in its entirety.

BACKGROUND

1. Field

Various embodiments relate to a memory related technology, and more particularly, to a memory device, a memory controller and a memory system including such components, and a method for operating the system.

2. Discussion of the Related Art

The computer environment paradigm has shifted to ubiquitous computing systems that can be used anytime and anywhere. Due to this, use of portable electronic devices such as mobile phones, digital cameras, and notebook computers has rapidly increased. These portable electronic devices generally use a memory system having one or more memory devices for storing data. A memory system may be used as a main or an auxiliary storage device of a portable electronic device.

Memory systems provide excellent stability, durability, high information access speed, and low power consumption because they have no moving parts, as compared with a hard disk device. Examples of memory systems having such advantages include universal serial bus (USB) memory devices, memory cards having various interfaces, and solid state drives (SSD).

SUMMARY

Various embodiments are directed to a memory device, a memory controller and a memory system including them, and a method for operating them, capable of increasing operational efficiency.

In an embodiment, a memory system may include: a memory device storing data and including a memory interface in communication with a memory controller; and the memory controller controlling the memory device and including a controller interface in communication with the memory device, and, wherein, when the memory device is inaccessible, the memory controller requests a current state information including current operation mode of the memory interface from the memory device, and changes an operation mode of the controller interface to match the current operation mode of the memory interface according to the current state information received from the memory device.

In the above memory system, each of the memory interface and the controller interface may operate in a Double Data Rate (DDR) mode or a Single Data Rate (SDR) mode. The memory controller may request the current state information using a current state request signal which maintains a specific logical value for a first time period after being activated. The current state request signal may include a read enable signal. The memory device may monitor the current state request signal and output the current state information upon elapse of the first time period. The memory device may output the current state information until the current state request signal becomes inactive or for a second time period from elapse of the first time period. The memory device may output the current state information using a data signal. The current state information may include a data structure including a bit having a logical high value or a logical low value indicative of an operation mode of the memory interface. The current state information may further include at least one of information about whether a reset of the memory device is needed and information about whether a Content Addressable Memory (CAM) read of the memory device is needed. The memory controller may output at least one of a reset command and a CAM read command to the memory device according to the current state information. The current state information may include a data structure including at least one of a bit having a logical high value or a logical low value indicative of whether the reset of the memory device is needed and a bit having a logical high value or a logical low value indicative of whether the CAM read of the memory device is needed.

In an embodiment, a controller may include: a first interface for communication with a memory device; and a processor, wherein, when the memory device is inaccessible, the processor requests current state information including a current operation mode of a second interface of the memory device from the memory device, and changes an operation mode of the first interface to match the current operation mode of the second interface according to the current state information received from the memory device.

In the above controller, each of the first interface and the second interface may operate in a Double Data Rate (DDR) mode or a Single Data Rate (SDR) mode. The processor may request the current state information using a current state request signal which maintains a specific logical value for a first time period after being activated. The current state request signal may include a read enable signal. The current state information may further include at least one of information about whether a reset of the memory device is needed and information about whether a Content Addressable Memory (CAM) read of the memory device is needed. The processor may output at least one of a reset command and a CAM read command to the memory device according to the current state information.

In an embodiment, a memory device may include: an interface for communication with a memory controller; and a processor, wherein, in response to a request of current state information of the memory controller, the processor outputs the current state information regarding a current operation mode of the interface to the memory controller.

In the above memory device, the interface may operate in a Double Data Rate (DDR) mode or a Single Data Rate (SDR) mode. The request of the current state information may be performed using a current state request signal which maintains a specific logical value for a first time period after being activated, and the processor may monitor the current state request signal and output the current state information upon elapse of the first time period. The processor may output the current state information until the current state request signal becomes inactive or for a second time from the elapsed time of the first time. The processor may output the current state information using a data signal. The current state information may include a data structure including a bit having a logical high value or a logical low value according to an operation mode of the memory interface. The current state information may further include at least one of information about whether a reset of the memory device is needed and information about whether a Content Addressable Memory (CAM) read of the memory device is needed. The current state information may include a data structure including at least one of a bit having a logical high value or a logical low value according to whether the reset of the memory device is needed and a bit having a logical high value or a logical low value according to whether the CAM read of the memory device is needed.

In an embodiment, a method for operating a memory system, which includes a memory device storing data and a memory controller controlling the memory device, may include: the memory controller requesting a current state information including a current operation mode of a memory interface to the memory device when the memory device is inaccessible; the memory device generating the current state information according to the request of the current state information and outputting the current state information to the memory controller; the memory controller analyzing the current state information to determine whether the current operation mode of the memory interface matches a current operation mode of a controller interface of the memory controller; and the memory controller changing the current operation mode of the controller interface if the current operation mode of the memory interface is determined to be inconsistent with the current operation mode of the controller interface.

In the above method, the current state information may further include information about whether a reset of the memory device is needed, and the memory controller may analyze the current state information and perform the reset of the memory device after changing the current operation mode of the controller interface if it is determined that the reset of the memory device is needed. The current state information may further include information about whether a Content Addressable Memory (CAM) read of the memory device is needed, and the memory controller may analyze the current state information and perform the CAM read of the memory device after changing the current operation mode of the controller interface if it is determined that the CAM read of the memory device is needed. Each of the memory interface and the controller interface may operate in a Double Data Rate (DDR) mode or a Single Data Rate (SDR) mode. The request of the current state information may be performed using a current state request signal which maintains a specific logical value for a first time after being activated. The current state request signal may include a read enable signal. The outputting of the current state information may include monitoring the current state request signal and outputting the current state information from an elapsed time of the first time. The outputting of the current state information may include outputting the current state information until the current state request signal becomes inactive or for a second time from the elapsed time of the first time. The outputting of the current state information may be performed using a data signal.

In an embodiment, a method for operating a controller, which controls a memory device, may include: requesting a current state information including a current operation mode of a memory interface to the memory device when the memory device is inaccessible; analyzing the current state information received from the memory device to determine whether the current operation mode of the memory interface matches a current operation mode of a controller interface of the controller; and changing the current operation mode of the controller interface if the current operation mode of the memory interface is determined to be inconsistent with the current operation mode of the controller interface.

In the above method, the current state information may further include information about whether a reset of the memory device is needed, and the controller may analyze the current state information and perform the reset of the memory device after changing the current operation mode of the controller interface if it is determined that the reset of the memory device is needed. The current state information may further include information about whether a Content Addressable Memory (CAM) read of the memory device is needed, and the controller may analyze the current state information and perform the CAM read of the memory device after changing the current operation mode of the controller interface if it is determined that the CAM read of the memory device is needed. Each of the memory interface and the controller interface may operate in a Double Data Rate (DDR) mode or a Single Data Rate (SDR) mode. The request of the current state information may be performed using a current state request signal which maintains a specific logical value for a first time after being activated. The current state request signal may include a read enable signal.

In an embodiment, a method for operating a memory device, which is controlled by a memory controller, may include: generating a current state information including a current operation mode of the memory device according to a request of the current state information of the memory controller; and outputting the current state information to the memory controller.

In the above method, the current state information may further include information about whether a reset of the memory device is needed. The current state information may further include information about whether a Content Addressable Memory (CAM) read of the memory device is needed. Each of the memory interface and the controller interface may operate in a Double Data Rate (DDR) mode or a Single Data Rate (SDR) mode. The request of the current state information may be performed using a current state request signal which maintains a specific logical value for a first time after being activated, and the outputting of the current state information may include monitoring the current state request signal and outputting the current state information from an elapsed time of the first time. The outputting of the current state information may include outputting the current state information until the current state request signal becomes inactive or for a second time from the elapsed time of the first time. The outputting of the current state information may be performed using a data signal.

In an embodiment, a memory system may include: a memory device configured to operate in any of a plurality of operation modes, the memory device including cells storing data, and a memory interface configured to have any of a plurality of interface states respectively enabling the plurality of operation modes of the memory device; and a memory controller configured to operate in any of the plurality of operation modes, the memory controller including a controller interface, in communication with the memory interface, configured to have any of the plurality of interface states respectively enabling the plurality of operation modes of the memory controller; wherein the memory controller requests from the memory device information including a current state of the memory interface when the memory device is inaccessible, the memory device sends the requested information to the memory controller, and the memory controller changes a current interface state of the controller interface based on the information.

BRIEF DESCRIPTION OF THE DRAWINGS

These and other features and advantages of the present disclosure will become apparent to those skilled in the art to which the present disclosure pertains from the following detailed description in reference to the accompanying drawings.

FIG. 6 is a diagram illustrating an example of a data structure of a current state information generated in the memory device of FIG. 5.

DETAILED DESCRIPTION

Figure 1:
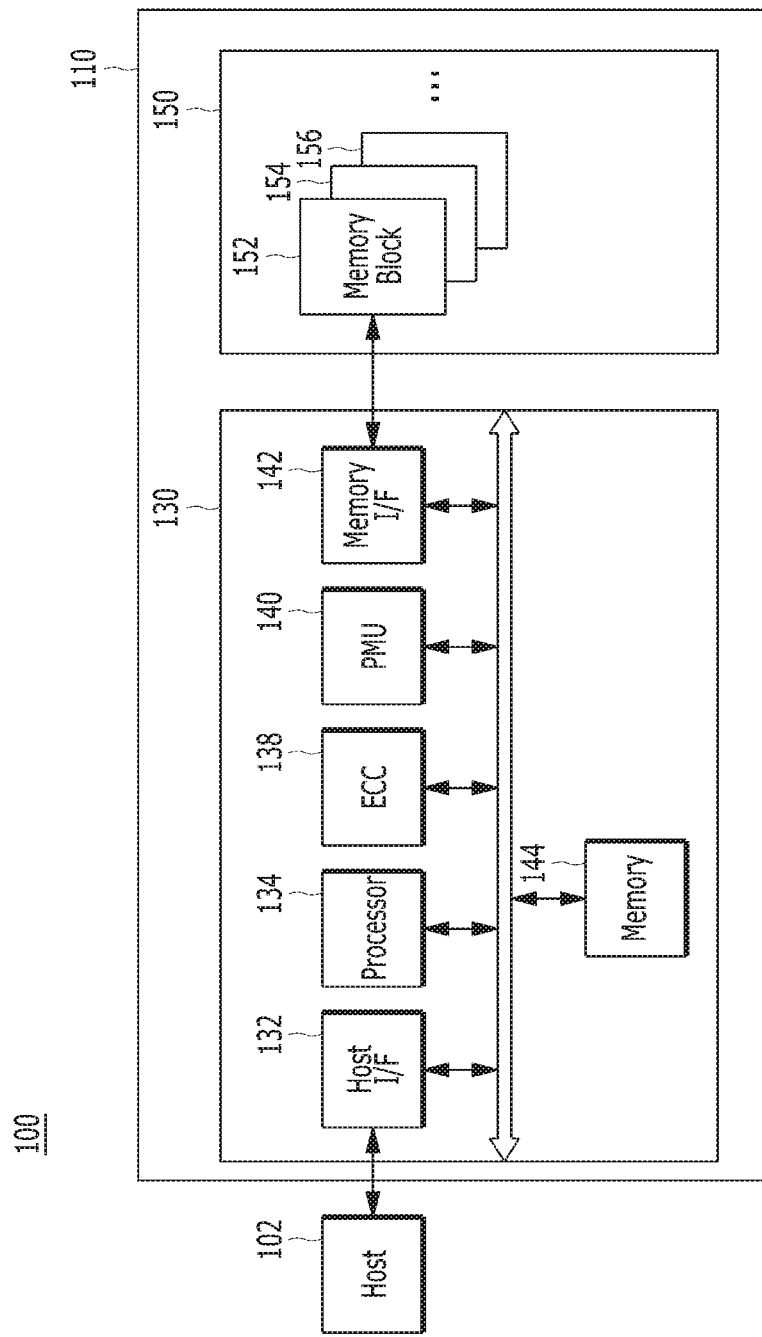
FIG. 1 is a block diagram illustrating a data processing system including a memory system in accordance with an embodiment of the present disclosure.

Various embodiments of the present disclosure are described below in more detail with reference to the accompanying drawings. It is noted, however that elements and features of the present disclosure may be configured or arranged differently than shown or described herein. Thus, the present invention is not limited to the embodiments set forth herein. Rather, the described embodiments are provided so that this disclosure is thorough and complete and fully conveys the present disclosure to those skilled in the art to which this disclosure pertains. Throughout the disclosure, like reference numerals refer to like parts throughout the various figures and embodiments of the present disclosure.

It will be understood that, although the terms "first", "second", "third", and so on may be used herein to identify various elements, these elements are not limited by these terms. These terms are used to distinguish one element from another element that otherwise have the same or similar names. Thus, a first element in one instance could be identified as a second or third element in another instance without departing from the spirit and scope of the present disclosure.

The drawings are not necessarily to scale and, in some instances, proportions may have been exaggerated in order to clearly illustrate features of the embodiments.

It will be further understood that when an element is referred to as being "connected to", "coupled to", or "in communication with" another element, such connection, coupling, or communication may be direct or through one or more intervening elements. In addition, it will also be understood that when an element is referred to as being "between" two elements, it may be the only element between the two elements, or one or more intervening elements may also be present.

The terminology used herein is for describing particular embodiments and is not intended to be limiting of the present disclosure. As used herein, singular forms are intended to include the plural forms and vice versa, unless the context clearly indicates otherwise. It will be further understood that the terms "comprises," "comprising," "includes," and "including" when used in this specification, specify the presence of the stated elements but do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present disclosure belongs in view of the present disclosure. It will be further understood that terms, such as those defined in commonly used dictionaries, should be interpreted as having a meaning that is consistent with their meaning in the context of the present disclosure and the relevant art and not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

It is also noted, that in some instances, as would be apparent to those skilled in the relevant art, a feature or element described in connection with one embodiment may be used singly or in combination with other features or elements of another embodiment, unless otherwise specifically indicated. Also, throughout the specification, reference to "an embodiment," "another embodiment," or the like is not necessarily to only one embodiment, and different references to any such phrase are not necessarily to the same embodiment(s).

FIG. 1 is a block diagram illustrating a data processing system 100 including a memory system 110 in accordance with an embodiment of the present disclosure.

Referring to FIG. 1, the data processing system 100 may include a host 102 and the memory system 110.

The host 102 may include portable electronic devices such as a mobile phone, MP3 player and laptop computer or non-portable electronic devices such as a desktop computer, a game machine, a TV and a projector.

The memory system 110 may operate to store data for the host 102 in response to a request of the host 102. Non-limiting examples of the memory system 110 include a solid state drive (SSD), a multi-media card (MMC), a secure digital (SD) card, a universal storage bus (USB) device, a universal flash storage (UFS) device, compact flash (CF) card, a smart media card (SMC), a personal computer memory card international association (PCMCIA) card, and a memory stick. The MMC may include an embedded MMC (eMMC), a reduced size MMC (RS-MMC), and a micro-MMC. The SD card may include a mini-SD card and a micro-SD card.

The memory system 110 may be embodied by various types of storage devices. Non-limiting examples of storage devices included in the memory system 110 include volatile memory devices such as a DRAM dynamic random access memory (DRAM) and a static RAM (SRAM), and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM), and a flash memory. The flash memory may have a 3-dimensional (3D) stack structure.

The memory system 110 may include a memory device 150 and a controller 130. The memory device 150 may store data for the host 120. The controller 130 may control data storage into the memory device 150.

The controller 130 and the memory device 150 may be integrated into a single semiconductor device, which may be included in any of the various types of memory systems described above.

Non-limiting application examples of the memory system 110 include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device that retains data stored therein even when power is not supplied. The memory device 150 may store data provided from the host 102 through a write operation. The memory device 150 may provide data stored therein to the host 102 through a read operation. The memory device 150 may include a plurality of memory dies (not shown), each memory die including a plurality of planes (not shown), each plane including a plurality of memory blocks 152 to 156. Each of the memory blocks 152 to 156 may include a plurality of pages, and each of the pages may include a plurality of memory cells coupled to a word line.

The controller 130 may control the memory device 150 in response to a request from the host 102. For example, the controller 130 may provide data read from the memory device 150 to the host 102, and store data provided from the host 102 into the memory device 150. For this operation, the controller 130 may control read, write, program and erase operations of the memory device 150.

The controller 130 may include a host interface (I/F) 132, a processor 134, an error correction code component (ECC) 138, a Power Management Unit (PMU) 140, a NAND flash controller (NFC) 142 and a memory 144, all operatively coupled, or in communication, via an internal bus.

The host interface 132 may be configured to process a command and data of the host 102, and may communicate with the host 102 according to one or more of various interface protocols such as universal serial bus (USB), multi-media card (MMC), peripheral component interconnect-express (PCI-E), small computer system interface (SCSI), serial-attached SCSI (SAS), serial advanced technology attachment (SATA), parallel advanced technology attachment (DATA), enhanced small disk interface (ESDI), and integrated drive electronics (IDE).

The ECC 138 may detect and correct an error contained in the data read from the memory device 150. In other words, the ECC 138 may perform an error correction decoding process to the data read from the memory device 150 through an ECC code used during an ECC encoding process. According to a result of the error correction decoding process, the ECC 138 may output a signal, for example, an error correction success or fail signal. When the number of error bits is more than a threshold value of correctable error bits, the ECC 138 may not correct the error bits, and may instead output an error correction fail signal.

The ECC 138 may perform error correction through a coded modulation such as Low Density Parity Check (LDPC) code, Bose-Chaudhri-Hocquenghem (BCH) code, turbo code, Reed-Solomon code, convolution code, Recursive Systematic Code (RSC), Trellis-Coded Modulation (TCM) and Block coded modulation (BCM). However, the ECC 138 is not limited to these error correction techniques. As such, the ECC 138 may include all circuits, modules, systems or devices for suitable error correction.

The PMU 140 may manage electrical power used and provided in the controller 130.

The NFC 142 may serve as a memory/storage interface for interfacing the controller 130 and the memory device 150 such that the controller 130 controls the memory device 150 in response to a request from the host 102. When the memory device 150 is a flash memory or specifically a NAND flash memory, the NFC 142 may generate a control signal for the memory device 150 to process data provided to the memory device 150 under the control of the processor 134. The NFC 142 may work as an interface (e.g., a NAND flash interface) for processing a command and data between the controller 130 and the memory device 150. Specifically, the NFC 142 may support data transfer between the controller 130 and the memory device 150.

The memory 144 may serve as a working memory of the memory system 110 and the controller 130. The memory 144 may store data supporting operations of the memory system 110 and the controller 130. The controller 130 may control the memory device 150 to perform read, write, program and erase operations in response to a request from the host 102. The controller 130 may provide data read from the memory device 150 to the host 102, and may store data provided from the host 102 into the memory device 150. The memory 144 may store data required for the controller 130 and the memory device 150 to perform these operations.

The memory 144 may be embodied by a volatile memory. For example, the memory 144 may be embodied by static random access memory (SRAM) or dynamic random access memory (DRAM). The memory 144 may be disposed within or externally to the controller 130. FIG. 1 illustrates an example of the memory 144 disposed within the controller 130. In another embodiment, the memory 144 may be embodied by an external volatile memory having a memory interface transferring data between the memory 144 and the controller 130.

The processor 134 may control the overall operations of the memory system 110. The processor 134 may use firmware to control the overall operations of the memory system 110. The firmware may be referred to as flash translation layer (FTL).

The processor 134 of the controller 130 may include a management unit (not illustrated) for performing a management operation of bad block(s) of the memory device 150. The management unit may perform a bad block management operation of checking a bad block among the plurality of memory blocks 152 to 156 in the memory device 150. The bad block may be where a program fail occurs during a program operation, due to the characteristics of a NAND flash memory. The management unit may write the program-failed data of the bad block to a new memory block. In the memory device 150 having a 3D stack structure, the bad block management operation may reduce the use efficiency of the memory device 150 and the reliability of the memory system 110. Thus, the bad block management operation needs to be performed with more reliability.

In a memory system in accordance with an embodiment of the present disclosure, the controller 130 may perform a plurality of command operations, corresponding to a plurality of commands received from the host 102, on the memory device 150. For example, the controller 130 may perform a plurality of program operations corresponding to a plurality of write commands, a plurality of read operations corresponding to a plurality of read commands and a plurality of erase operations corresponding to a plurality of erase commands. In correspondence to performing the command operations, the controller 130 may update metadata, in particular, map data. In particular, in the memory system in accordance with an embodiment of the present disclosure, when the controller 130 performs command operations corresponding to the plurality of commands received from the host 102 on the plurality of memory blocks, characteristic degradations may occur in the memory blocks and, as a result, the operational reliability of the memory device 150 may deteriorate. Thus, the controller 130 performs command operations and a swap operation in the memory blocks of the memory device 150 based on parameters for the memory device 150 in correspondence to the performing of the command operations.

In the memory system in accordance with an embodiment of the present disclosure, characteristic degradations may occur in memory blocks in as a result of performance of command operations thereon. When command operations are performed for memory blocks in which such characteristic degradations occur, failures may occur in performing the command operations. Therefore, in the memory system, the controller 130 checks parameters for the memory blocks on which the command operations are performed. In particular, for the erase operations and program operations performed in the plurality of memory blocks, the controller 130 may check erase counts, program counts, program/erase (P/E) cycles or erase/write (E/W) cycles. To reduce or minimize the occurrence of failures in performing command operations due to characteristic degradations in the memory blocks, the controller 130 performs command operations and a swap operation in consideration of parameters. Since detailed description will be made below with reference to FIGS. 5 to 8 for performing command operations and a swap operation in consideration of parameters for the memory blocks of the memory device 150, further description thereof is omitted here.

A management unit (not shown) for performing bad management for the memory device 150 may be included in, or implemented by, the processor 134 of the controller 130. The management unit checks for a bad block in the plurality of memory blocks 152, 154, 156. The management unit may perform bad block management by identifying or labeling a bad block as bad. In the case where the memory device 150 is a flash memory, for example, a NAND flash memory, a program failure may occur when the controller 130 carries out a program operation with a write data, i.e., data program, due to the characteristic of the NAND flash memory. In that case, bad block management means that a memory block where the program failure has occurred is determined as a bad, and program-failed data are written, that is, programmed, in a new memory block. Moreover, even in the case where the memory device 150 has a 3-dimensional stack structure as described above, the corresponding bad memory block is treated as a bad block. It is necessary to reliably perform bad block management because the utilization efficiency of the memory device 150 and the reliability of the memory system 110 may deteriorate abruptly. A memory device in the memory system in accordance with an embodiment of the present disclosure will be described below in detail with reference to FIGS. 2 to 4.

Figure 2:
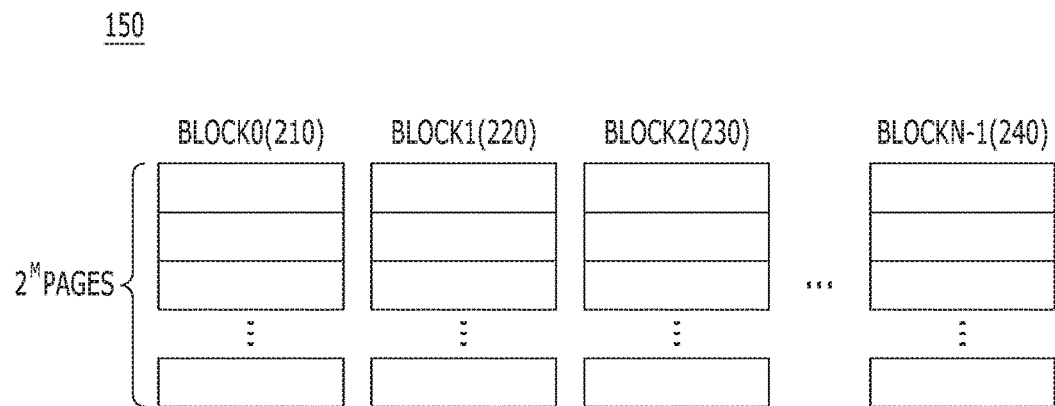
FIG. 2 is a schematic diagram illustrating an exemplary configuration of a memory device employed in the memory system shown in FIG. 1.

FIG. 2 is a schematic diagram illustrating an example of the memory device 150.

Referring to FIG. 2, the memory device 150 may include a plurality of memory blocks, e.g., BLOCK0 (210), BLOCK1 (220), BLOCK2 (230) to BLOCKN−1 (240), and each of these blocks may include a plurality of pages, for example, $2^M$ pages, the number of which may vary according to circuit design. Memory cells included in the respective memory blocks may be one or more of a single level cell (SLC) storing 1-bit data, or a multi-level cell (MLC) storing 2- or more bit data. In an embodiment, the memory device 150 may include a plurality of triple level cells (TLC) each storing 3-bit data. In another embodiment, the memory device may include a plurality of quadruple level cells (QLC) each storing 4-bit level cell.

Figure 3:
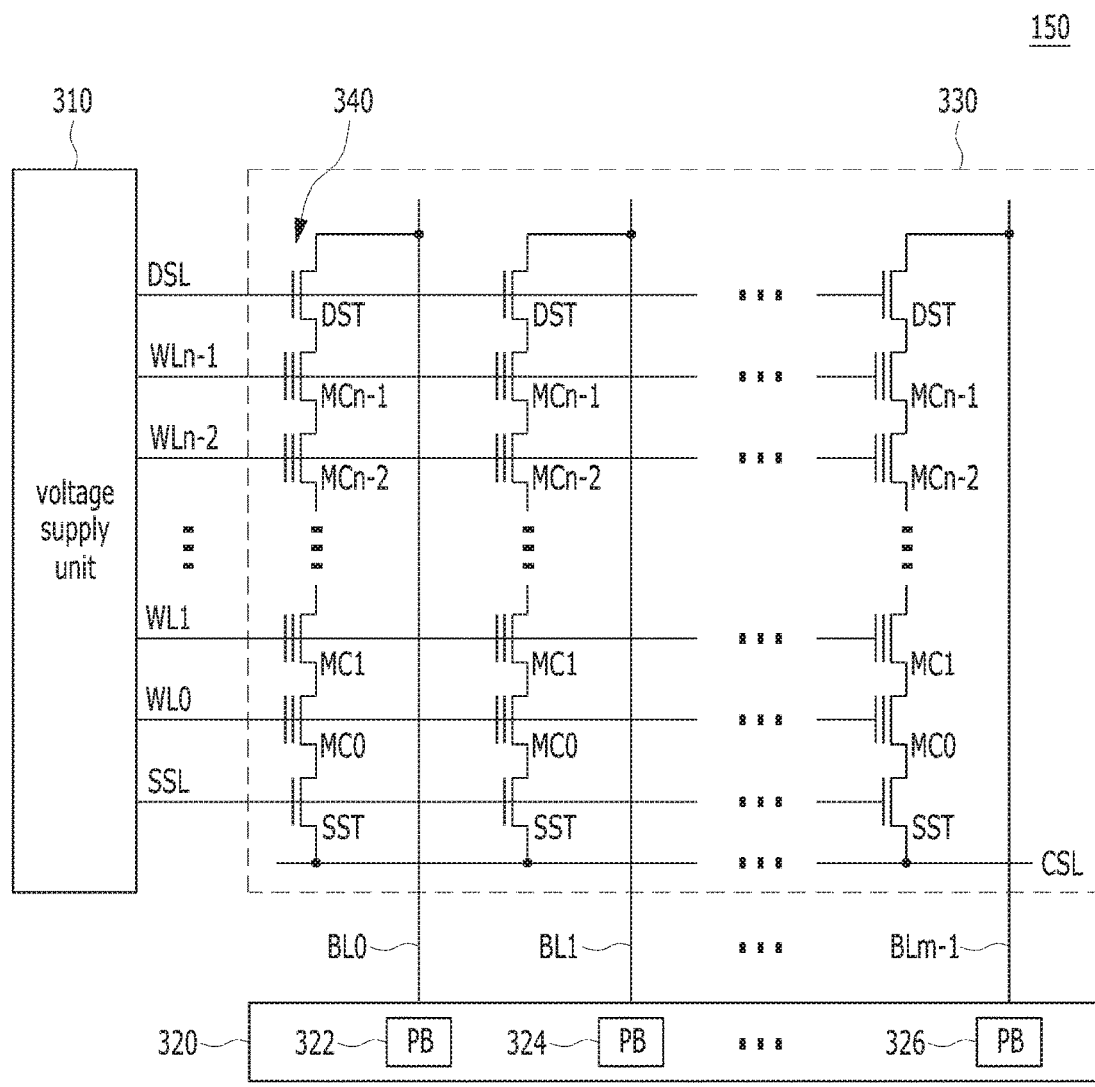
FIG. 3 is a circuit diagram illustrating an exemplary configuration of a memory cell array of a memory block in the memory device shown in FIG. 2.

FIG. 3 is a circuit diagram illustrating an exemplary configuration of a memory cell array of a memory block in the memory device 150.

Referring to FIG. 3, a memory block 330, which may correspond to any of the plurality of memory blocks 152 to 156 in the memory device 150 of the memory system 110, may include a plurality of cell strings 340 coupled to a plurality of corresponding bit lines BL0 to BLm−1. The cell string 340 of each column may include one or more drain select transistors DST and one or more source select transistors SST. Between the drain and source select transistors DST, SST, a plurality of memory cells MC0 to MCn−1 may be coupled in series. In an embodiment, each of the memory cell transistors MC0 to MCn−1 may be embodied by an MLC capable of storing data information of a plurality of bits. Each of the cell strings 340 may be electrically coupled to a corresponding bit line among the plurality of bit lines BL0 to BLm−1. For example, as illustrated in FIG. 3, the first cell string is coupled to the first bit line BL0, and the last cell string is coupled to the last bit line BLm−1.

Although FIG. 3 illustrates NAND flash memory cells, the disclosure is not limited in this way. In another embodiment, the memory cells may be a NOR flash memory cells, or hybrid flash memory cells including two or more kinds of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply unit 310 which provides word line voltages including a program voltage, a read voltage and a pass voltage to supply to the word lines according to an operation mode. The voltage generation operation of the voltage supply unit 310 may be controlled by a control circuit (not illustrated). Under the control of the control circuit, the voltage supply unit 310 may select one of the memory blocks (or sectors) of the memory cell array, select one of the word lines of the selected memory block, and provide the word line voltages to the selected word line and the unselected word lines as may be needed.

The memory device 150 may include a read/write circuit 320 which is controlled by the control circuit. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and may supply a current or a voltage to drive bit lines according to the received data. The read/write circuit 320 may include a plurality of page buffers 322 to 326 respectively corresponding to columns (or bit lines) or column pairs (or bit line pairs). Each of the page buffers 322 to 326 may include a plurality of latches (not illustrated).

Figure 4:
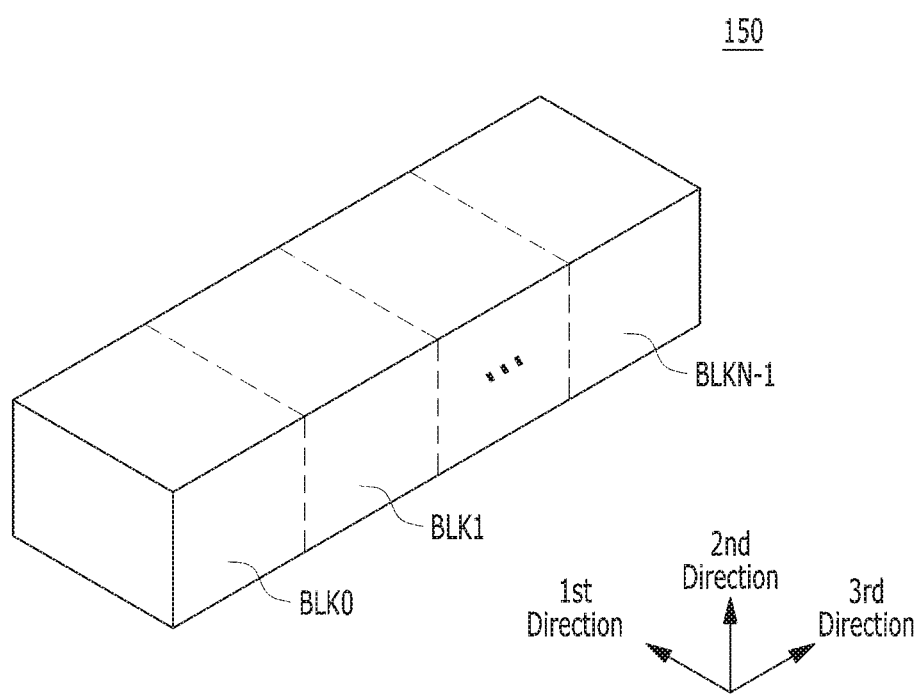
FIG. 4 is a schematic diagram illustrating an exemplary three-dimensional structure of the memory device shown in FIG. 2.

FIG. 4 is a schematic diagram illustrating an exemplary 3D structure of the memory device 150.

The memory device 150 may be embodied by a 2D or 3D memory device. Specifically, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN−1 each having a 3D structure (or vertical structure).

An interfacing between a controller and a memory device of a memory system such as that described above will be further described below.

A memory system may operate in various modes, if desired. For example, the memory system may operate in a single data rate (SDR) mode in which data is input/output synchronized with a rising or falling edge of a clock signal, or a double data rate (DDR) mode in which data is input/output synchronized with rising and falling edges of a clock signal. That is, the memory system may be a combined SDR/DDR memory system. The memory system may operate in the SDR mode to assure reliability in an initialization operation such as booting, and may operate in the DDR mode to secure a fast operation speed in other general operations such as program/read/erase operations.

In order for the memory system to operate in the SDR mode, both the memory device and the memory controller may be set to the SDR mode. Also, in order for the memory system to operate in the DDR mode, both the memory device and the memory controller may be set to the DDR mode. To this end, the memory device and the memory controller may include a memory interface and a controller interface implemented to selectively operate in either the SDR mode or the DDR mode. In other words, when the memory device and the memory controller are set to the SDR mode, both the memory interface and the controller interface may operate as an SDR interface. When the memory device and the memory controller are set to the DDR mode, both the memory interface and the controller interface may operate as a DDR interface.

However, in some cases, the operation mode of the memory device may be changed when the memory controller is in a particular state, and as a result, does not recognize the change, thereby causing a problem in interfacing between the memory device and the memory controller. As an example, when the power of the memory device, for example, VCC, is turned off and then back on in a state in which the memory controller enters a sleep mode and does not wake up, that is, during the sleep mode of the memory controller, the memory controller cannot recognize the previous OFF state of the memory device. However, when the power of the memory device is turned off and then on, the memory device may be initialized and automatically set to the SDR mode. Thus, if the memory system was operating in the DDR mode prior to the memory controller entering the sleep mode, the memory controller, upon waking up, may maintain the DDR mode while the memory device is in the SDR mode. That is, an interface mismatch in which the memory interface of the memory device operates in SDR mode while the controller interface of the memory controller operates in DDR mode may occur. As a result, the memory controller may not access the memory device.

Before the present invention, it had been considered to reset the memory device and perform a CAM (Content Addressable Memory) read if the memory controller fails to access the memory device, for example, if it outputs a read ID to the memory device but does not receive a normal response. The CAM read may be performed by the memory device and include reading various option information necessary for the operation of the memory system stored in a specific area, for example, a CAM cell in response to a CAM read command of the memory controller, and performing required operations according the option information. The option information may include operation setting information for controlling various operations such as program/read/erase operations, repair address information, bad block information, and the like. The required operations may include generating operation voltages having a predetermined level according to the operation setting information read from the CAM cell, setting a redundancy path according to the repair address information, setting a bad memory block to be unused according to the bad block information, and the like. When the CAM read operation of the memory device is completed, the memory device may output a ready signal, indicating a ready state in which a next operation can be performed, to the memory controller. The memory controller may detect that the ready signal or a busy signal outputted from the memory device. When the memory device is in the ready state, which may be recognized based on the ready signal or the busy signal, the controller may control the memory device so that a subsequent normal operation such as a program/read/erase operation is performed.

However, since the above-described reset or CAM read is a type of initialization operation and takes a considerable time to be achieved, unconditional reset and CAM read execution due to the failure of the memory controller to access the memory device may result in inefficiency such as increasing the overall operation time of the memory system.

In accordance with an embodiment of the present disclosure, instead of performing the unconditional reset and CAM read, the memory device may inform the memory controller of its current state (i.e., operational mode), so that the memory controller chooses to simply change its interface, or to perform the reset and/or CAM read as needed, based on the informed state. A more detailed description will be given with reference to FIGS. 5 to 8.

Figure 5:
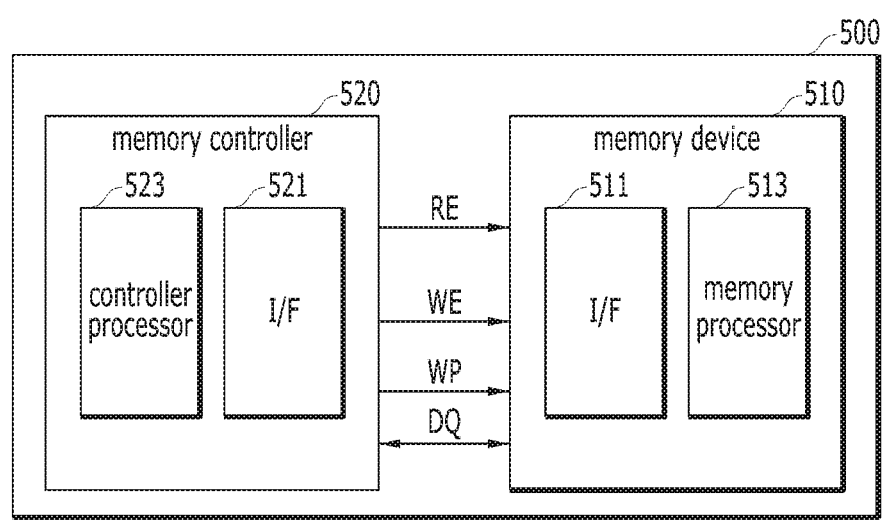
FIG. 5 is a diagram illustrating a memory system in accordance with another embodiment of the present disclosure.

FIG. 5 is a diagram illustrating a memory system in accordance with another embodiment of the present disclosure.

Referring to FIG. 5, the memory system 500 may operate in any of various modes, for example, an SDR mode or a DDR mode. The memory system 500 may include a memory device 510 in which data is stored and a memory controller 520 controlling operations performed on the memory device 510 in response to commands received from a host (not shown).

The memory controller 520 may include a controller interface 521 that can operate as an SDR interface or a DDR interface for supporting the SDR mode or the DDR mode of the memory system 500. As will be described later, the controller interface 521 may change from the SDR interface to the DDR interface or from the DDR interface to the SDR interface, depending on current state information of the memory device 510.

When the memory controller 520 enters a sleep mode, it cannot know a state change of the memory device 510 until wake-up. Accordingly, when the memory device 510 is powered off and then back on during the sleep mode of the memory controller 520, the memory controller 520 may not access the memory device 510 due to mismatch in modes with respect to the memory device 510. If the memory controller 520 fails to access the memory device 510, for example, if the woke-up memory controller 520 outputs a read ID to the memory device 510 but receives an abnormal response, the memory controller 520 may assume that the state of the memory device 510 has changed. The memory controller 520 may output a signal for confirming the current state of the memory device 510, that is, a current state request signal, to the memory device 510.

Here, the current state request signal may be a signal that can be maintained at a specific logical value, e.g., "HIGH" or "LOW", for a set or predetermined period of time after being activated. The current state request signal may be output to the memory device 510 through various control terminals of the memory controller 520. The control terminal may include a read enable (RE), a write enable (WE) terminal, a write protect (WP) terminal, and the like. The read enable (RE) terminal is used for outputting data when a read enable (RE) signal is applied. The write enable (WE) terminal is used for inputting data or a command when a write enable (WE) signal is applied and which. The write protect (WP) terminal, to which a write protect (WP) signal is applied, is used for protecting the memory device 510 when an abrupt program or erase operation is performed. In other words, the memory controller 520 may use, as the current state request signal some, conventional control signals such as the read enable signal, the write enable signal, the write protect signal, and the like. However, in another embodiment, it may be possible for the memory controller 520 to generate a new control signal and use it as the current state request signal. The case where the read enable signal is used as the current state request signal will be described by way of example. Furthermore, the memory controller 520 may control the operation of the memory device 510 using these control signals. The memory controller 520 may exchange data with the memory device 510 through a DQ terminal to which data is applied.

The memory controller 520 may receive the current state information of the memory device 510 from the memory device 510 in response to the current state request. The memory controller 520 may analyze the received current state information to determine a subsequent process for accessing the memory device 510. To this end, the memory controller 520 may include a controller processor 523.

The controller processor 523 may analyze the current state information input from the memory device 510 and control the controller interface 521 and/or the memory device 510 according to the result of the analysis. The current state information may include information indicating a current interface state of the memory device 510, that is, whether the memory interface 511 is operating as an SDR interface or a DDR interface. Further, the current state information may further include information indicating whether the memory device 510 is in a state in which a reset is needed and/or another state in which a CAM read is needed.

As a result of the state information analysis, if the current interface state of the memory device 510 is different from the current interface state of the memory controller 520, the controller processor 523 may change the state (or operation mode) of the controller interface 521 to match the current interface state of the memory device 510. For example, when the memory interface 511 of the memory device 510 currently operates as the SDR interface, the controller interface 521, currently operating in the DDR mode, may be changed to operate in the SDR mode. When the controller processor 523 matches the state of the controller interface 521 with the state of the memory interface 511, the memory controller 520 may access the memory device 510 to perform a subsequent normal operation, for example, program/read/erase operations.

In some cases, however, the memory device 510 may not be accessed simply by changing the state of the controller interface 521 from the SDR mode to the DDR mode or vice versa.

This may occur, for example, in a stuck state where normal operation cannot be performed even if the memory device 510 enters an operation. In this case, the memory controller 520 cannot check the ready state of the ready/busy signal and cannot output the command to the memory device 510, and accordingly, the reset of the memory device 510 may be required. The stuck state may be confirmed by the memory device 510. More specifically, the memory device 510 may estimate its operation time and determine whether the estimated operation time has elapsed through its internal clock. When the estimated operation time has elapsed, the memory device 510 may determine that it is in the stuck state. Accordingly, the current state information generated by the memory device 510 may include information about whether the memory device 510 needs to be reset. As a result of the state information analysis by the controller processor 523, when it is determined that the reset of the memory device 510 is necessary, a reset command is output via the DQ terminal to the memory device 510 so that the memory device 510 may be reset. When the memory device 510 is reset, the memory device 510 may return to an unstuck state. Since this reset operation proceeds after the interface matching between the memory controller 520 and the memory device 510, an error may not occur in the reset command transmission. Thereafter, access to the memory device 510 may be followed to perform subsequent general operations, for example, program/read/erase operations.

As another example, the memory device 510 may not be accessed simply by changing the state of the controller interface 521 when the memory device 510 is in a state in which it has not read various option information stored in a specific area, for example, a CAM cell, before entering the operation. In such a case, a CAM read of the memory device 150 may be required. Meanwhile, the memory device 510 may determine by itself whether it has read the CAM cell information. Therefore, the current state information generated by the memory device 510 may include information about whether the CAM read is needed. As a result of the state information analysis of the controller processor 523, when it is determined that the CAM read of the memory device 510 is necessary, a CAM read command is output via the DQ terminal to the memory device 510 so that the CAM read of the memory device 510 may be performed. When the CAM read of the memory device 510 is performed, the memory device 510 may enter the operation mode. Since this CAM read operation proceeds after the interface matching between the memory controller 520 and the memory device 510, an error may not occur in the transfer of the CAM read command. Thereafter, access to the memory device 510 may be available for performing subsequent general operations, for example, program/read/erase operations.

To sum up, the memory controller 520 may change its interface, control the reset of the memory device 510, or control the CAM read of the memory device 510, depending on the analysis of the current state information of the memory device 510.

As an example, the memory device 510 may be a NAND flash memory. The memory device 510 may include a memory interface 511 that is possible to operate as an SDR interface or a DDR interface for the operation of the SDR mode or DDR mode of the memory system 500 described above.

The power of the memory device 510, for example, VCC, may be turned off and on again in a state in which the memory controller 520 cannot recognize it. When the memory device 510 is turned off and then back on, the memory device 510 may be initialized and set to the SDR mode regardless of the previous operation mode of the memory device 510. That is, the memory interface 511 may operate in the SDR mode.

The memory device 510 may generate its current state information in response to a current state request input from the memory controller 520 and output this information to the memory controller 520. The current state information may be included in the data signal output to the DQ terminal of the memory controller 520. However, in another embodiment, it may be possible to add a new signal to send the current state information. To this end, the memory device 510 may further include a memory processor 513 in addition to the memory interface 511 described above.

The memory processor 513 may monitor control signals received from the memory controller 520, in particular, the current state request signal, to determine whether there is a request for the current state information of the memory device 510 from the memory controller 520. The memory processor 513 may monitor the current state request signal and determine that there is a request for the current state information from the memory controller 520 if the current state request signal is activated and maintained at a specific logical value for a set or predetermined period of time. For example, when the read enable signal is used as the current state request signal, it may be determined that the current state request signal is activated if the read enable signal transitions from "HIGH" to "LOW." It may be determined that there is the request for the current state information from the memory controller 520 if the current state request signal remains low for the set or predetermined period of time. The memory processor 513 may confirm whether the set or predetermined time has elapsed, that is, a low holding time, through the internal clock of the memory device 510.

If the memory processor 513 determines that there is the request regarding the current state information, the memory processor 513 may generate the current state information and output the current state information through the memory interface 511. As described above, the current state information may include the current operation mode of the memory device 510, i.e., the current interface state. Further, the current state information may include information indicating whether the memory device 510 is in a state which requires the reset and/or the CAM read. This will be described by way of example with reference to FIG. 6 to be described later.

When the current state information is included in the data signal output through the DQ terminal of the memory controller 520, the memory device 510 may have the authority to operate the DQ terminal from the time when it is determined that there is the request for the current state information. This data signal may be output as a fixed value during a set or predetermined current state information output period. The current state information output period may start at a time when it is determined that there is the request for the current state information, and terminate when the current state request signal is inactivated, for example, until the read enable signal transitions from "LOW" to "HIGH" or until a predetermined time has elapsed.

In the current state information output period of the memory device 510, the operation modes of the memory interface 511 of the memory device 510 and the controller interface 521 of the memory controller 520 may be inconsistent. This is because the memory controller 520 may not be able to confirm the current state information of the memory device 510 yet. However, since the data signal output from the memory device 510 maintains a fixed value without toggling, it may be transmitted to the memory controller 520 regardless of the operation modes of the memory interface 511 and the controller interface 521.

FIG. 6 is a diagram illustrating an example of a data structure of current state information generated in the memory device 510 of FIG. 5.

Referring to FIG. 6, when the data including the current state information has a length of a plurality of bits, for example, 8 bits, the last bit may be used to indicate the current interface state of the memory device 510. For example, when the value of the last bit is '0', the current interface of the memory device 510 may be the SDR interface, and when the value of the last bit is ° the current interface of the memory device 510 may be the DDR interface. In other words, this data may indicate that the memory device 510 is set to the SDR mode if the value of the last bit is '0', and the memory device 510 is set to the DDR mode if the value of the last bit is '1'.

In addition, the second-to-last bit of this 8-bit data may be used to indicate whether the CAM read of the memory device 510 is needed. For example, when the value of the second-to-last bit is '0', the CAM read of the memory device 510 may not be required, and when the value of the second-to-last bit is '1', the CAM read of the memory device 510 may be required.

In addition, the third-to-last bit of this 8-bit data may be used to indicate whether the reset of the memory device 510 is needed. For example, when the value of the third-to-last bit is '0', the reset of the memory device 510 may not be required, and when the value of the third-to-last bit is '1', the reset of the memory device 510 may be required.

However, this present invention is not limited to the data structure of FIG. 6, and various modifications may be possible. For example, bits in different positions than those described above may be used to indicate the current interface state, whether CAM read is needed, and whether reset of the memory device 510 is needed.

Figure 7:
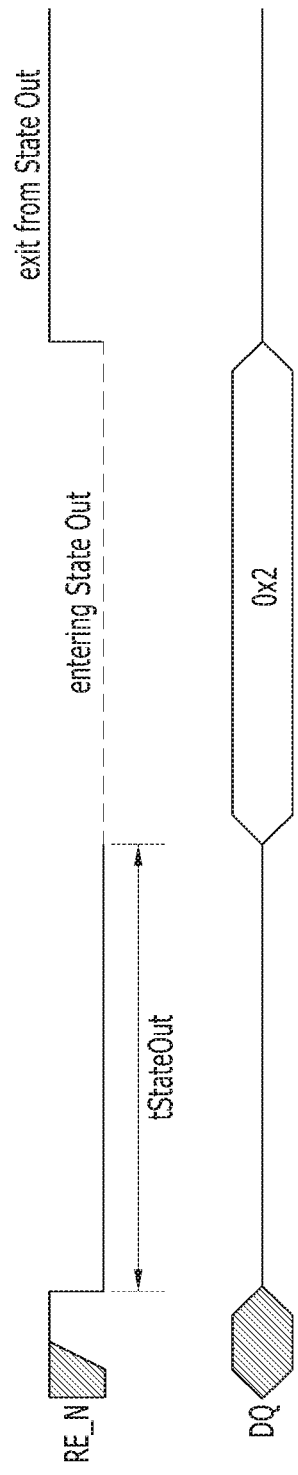
FIG. 7 is a timing diagram showing an exemplary relationship between a current state request signal output from the memory controller 520 and a current state response signal output from the memory device 510 in response to the current state request signal.

FIG. 7 is a timing diagram showing an exemplary relationship between a current state request signal output from the memory controller 520 and a current state response signal output from the memory device 510 in response to the current state request signal. In this example, the read enable signal may be used as the current state request signal, and the data signal may be used as the current state response signal.

Referring to FIG. 7, the read enable signal RE_N may be activated by transitioning from '1' to '0'. When the read enable signal RE_N is activated, the memory processor 513 of the memory device 510 may check the time during which the logical value of '0' is held by using the internal clock. If this time passes the appointment time tStateOut, the generation of the current state information by the memory processor 513 may be triggered. Thus, the memory device 510 may enter the current state information output period.

The generated current state information may be output as the data signal DQ until a set or predetermined time elapses from the appointment time tStateOut or until the read enable signal RE_N is inactivated, that is, transitions from '0' to '1'.

Figure 8:
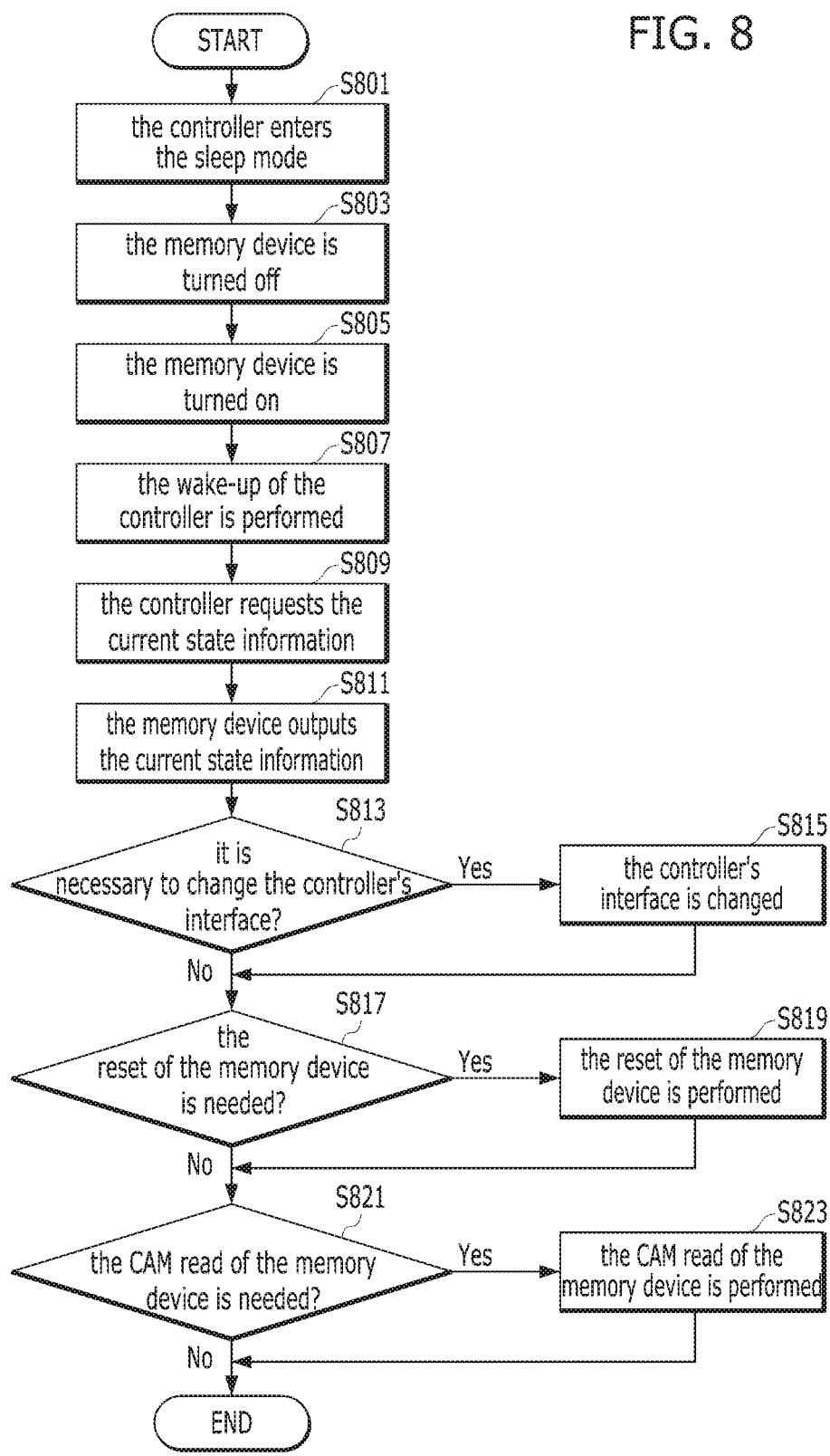
FIG. 8 is a flowchart illustrating a method for operating a memory system in accordance with another embodiment of the present disclosure.

FIG. 8 is a flowchart illustrating a method for operating a memory system in accordance with another embodiment of the present disclosure.

Referring to FIG. 8, the memory controller 520 may enter the sleep mode (s801).

Then, the memory device 520 may be turned off (s803) and turned on again (s805) while the memory controller 520 is in the sleep mode. Accordingly, the memory device 510 may be initialized and set to the SDR mode.

Then, wake-up of the memory controller 520 may be performed (s807). The woke-up memory controller 520 may not be aware of the previous power-off of the memory device 510 and the mode change due to this, so access failure to the memory device 510 may occur. Therefore, the following steps s809 to s823 may be performed.

The memory controller 520 may request the current state information from the memory device 510 (s809). That is, the memory controller 520 may output the current state request signal to the memory device 510. The current state request signal may be a signal that can be maintained at a specific logical value, for example, "LOW" for a set or predetermined period of time after being activated, and may use, for example, a read enable signal. Since the current state request signal has a fixed value for a set or predetermined period of time, there may be no problem in signal transmission even if there is an interface mismatch between the memory controller 520 and the memory device 510.

The memory device 510 may monitor the current state request signal. If it is determined that the current state request signal is activated and maintained for the set or predetermined period of time, the memory device 510 may generate current state information and output it in the current state response signal (s811). For example, the data signal may be used as the current state response signal. Since the current state response signal also has a fixed value for a set or predetermined period of time, there may be no problem in signal transmission even if there is an interface mismatch between the memory controller 520 and the memory device 510.

When the memory controller 520 receives the current state response signal, that is, the data including the current state information, it may analyze the data to determine whether to change the interface, perform the reset, perform the CAM read, and the like.

First, the memory controller 520 may compare the analyzed interface state of the memory device 510 with the interface state of the memory controller 520 to determine whether it is necessary to change its interface (s813).

If it is determined that the interface state of the memory device 510 is different from the interface state of the memory controller 520, the memory controller 520 may change its interface state (s815). On the other hand, if the interface state of the memory device 510 and the interface state of the memory controller 520 are the same, the memory controller 520 may not change its interface state. That is, since the interfaces of the memory device 510 and the memory controller 520 coincide with each other after steps s813 and s815, there may be no problem in interfacing between them, so the memory controller 520 may access the memory device 510 and control the operation of the memory device 510.

Then, the memory controller 520 may determine whether the reset of the memory device 510 is needed through the analyzed current state information of the memory device 510 (s817).

As a result of the determination, when the reset of the memory device 510 is needed, the memory device 510 may be reset by transmitting a reset command to the memory device 510 (s819). For reference, at this step, when the memory controller 520 and the memory device 510 are operating in the DDR mode and the memory device 510 is reset, the memory device 510 may be set to the SDR mode again. However, at this step, since the mode change of the memory device 510 is by the reset command of the memory controller 520, the memory controller 520 may recognize it. Thus, the memory controller 520 may change its interface to SDR mode by itself, thereby enabling interfacing between the memory controller 520 and the memory device 510. On the other hand, as a result of the determination, it may not be necessary to reset the memory device 510.

Then, the memory controller 520 may determine whether the CAM read of the memory device 510 is needed based on the analyzed current state information of the memory device 510 (s821).

As a result of the determination, if the CAM read of the memory device 510 is needed, the CAM read of the memory device 510 may be performed by transmitting a CAM read command to the memory device 510 (s823). On the other hand, as a result of the determination, it may not be necessary to perform the CAM read of the memory device 510.

Thus, interfacing between the memory device 510 and the memory controller 520 may be properly matched and the operation on the memory device 510 may be executed through communication between the memory device 510 and the memory controller 520. Therefore, subsequent normal operations may be performed.

According to embodiments of the memory system and operating method thereof described above, the memory device may inform the memory controller of its current state, thereby improving the interfacing between the memory controller and the memory device, and avoiding command transfer errors. Also, the memory controller may selectively perform necessary operations, so the operation efficiency may be increased.

Detailed description will be made, with reference to FIGS. 9 to 17, for a data processing system and electronic appliances to which the memory system 110 including the memory device 150 and the controller 130 described above, in accordance with embodiments of the present disclosure, may be applied.

FIGS. 9 to 17 are diagrams schematically illustrating exemplary applications of the data processing system of FIG. 1.

Figure 9:
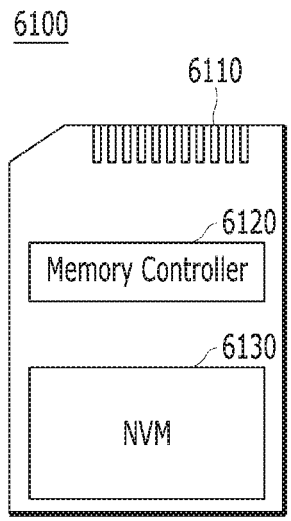
FIGS. 9 to 17 are diagrams schematically illustrating exemplary applications of the data processing system shown in FIG. 1 in accordance with various embodiments of the present disclosure.

FIG. 9 is a diagram schematically illustrating another example of the data processing system including the memory system in accordance with an embodiment. FIG. 9 schematically illustrates a memory card system to which the memory system is applied.

Referring to FIG. 9, the memory card system 6100 may include a memory controller 6120, a memory device 6130 and a connector 6110.

The memory controller 6120 may be connected to the memory device 6130 embodied by a nonvolatile memory. The memory controller 6120 may be configured to access the memory device 6130. For example, the memory controller 6120 may be configured to control read, write, erase and background operations of the memory device 6130. The memory controller 6120 may be configured to provide an interface between the memory device 6130 and a host, and use firmware for controlling the memory device 6130. That is, the memory controller 6120 may correspond to the controller 130 of the memory system 110 described with reference to FIGS. 1 to 8, and the memory device 6130 may correspond to the memory device 150 of the memory system 110 described with reference to FIGS. 1 to 8.

Thus, the memory controller 6120 may include a RAM, a processor, a host interface, a memory interface and an error correction component. The memory controller 130 may further include the elements shown in FIGS. 1 to 8.

The memory controller 6120 may communicate with an external device, for example, the host 102 of FIG. 1 through the connector 6110. For example, as described with reference to FIG. 1, the memory controller 6120 may be configured to communicate with an external device according to one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI, and Bluetooth. Thus, the memory system and the data processing system may be applied to wired/wireless electronic devices, particularly mobile electronic devices.

The memory device 6130 may be implemented by a nonvolatile memory. For example, the memory device 6130 may be implemented by any of various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM), and a spin torque transfer magnetic RAM (STT-RAM). The memory device 6130 may include a plurality of dies as in the memory device 150 of FIGS. 1 to 8.

The memory controller 6120 and the memory device 6130 may be integrated into a single semiconductor device. For example, the memory controller 6120 and the memory device 6130 may be so integrated to form a solid state driver (SSD). Alternatively, the memory controller 6120 and the memory device 6130 may be so integrated to form a memory card such as a PC card (PCMCIA: Personal Computer Memory Card International Association), a compact flash (CF) card, a smart media card (e.g., a SM and a SMC), a memory stick, a multimedia card (e.g., a MMC, a RS-MMC, a MMCmicro and an eMMC), an SD card (e.g., a SD, a miniSD, a microSD and a SDHC), and a universal flash storage (UFS).

Figure 10:
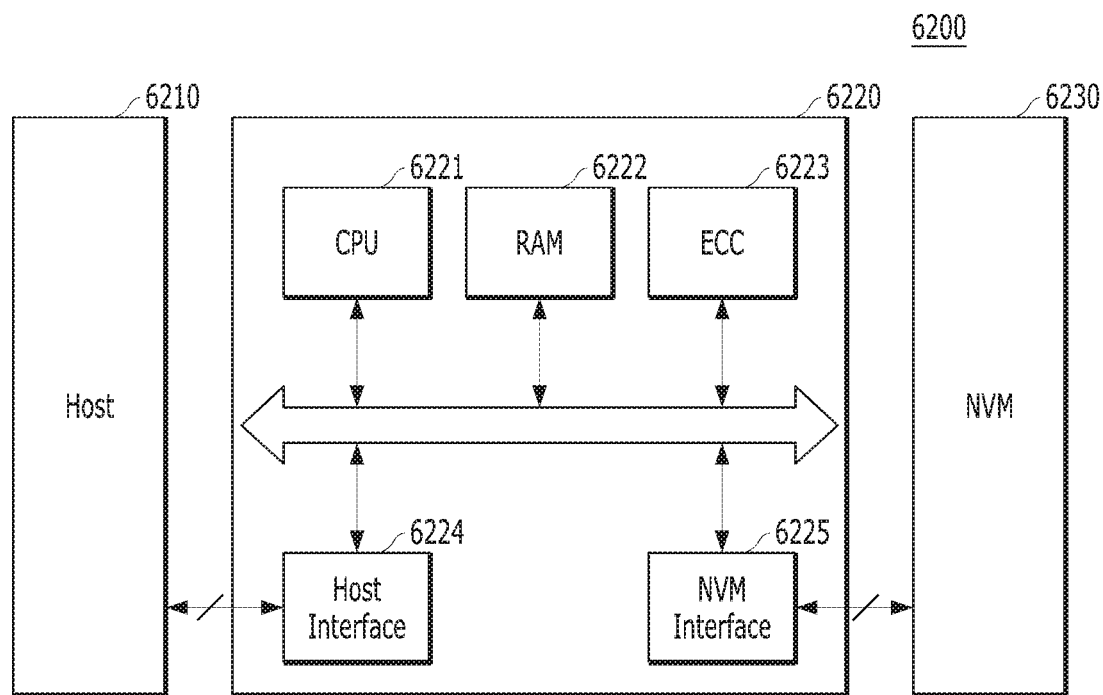

FIG. 10 is a diagram schematically illustrating another example of the data processing system including the memory system in accordance with an embodiment.

Referring to FIG. 10, the data processing system 6200 may include a memory device 6230 having one or more nonvolatile memories and a memory controller 6220 for controlling the memory device 6230. The data processing system 6200 illustrated in FIG. 10 may serve as a storage medium such as a memory card (CF, SD, micro-SD or the like) or USB device, as described with reference to FIG. 1. The memory device 6230 may correspond to the memory device 150 in the memory system 110 illustrated in FIGS. 1 to 8, and the memory controller 6220 may correspond to the controller 130 in the memory system 110 illustrated in FIGS. 1 to 8.

The memory controller 6220 may control a read, write or erase operation on the memory device 6230 in response to a request of the host 6210, and the memory controller 6220 may include one or more CPUs 6221, a buffer memory such as RAM 6222, an ECC circuit 6223, a host interface 6224 and a memory interface such as an NVM interface 6225.

The CPU 6221 may control overall operations on the memory device 6230, for example, read, write, file system management and bad page management operations. The RAM 6222 may be operated according to control of the CPU 6221. The RAM 6222 may be used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the low-speed memory device 6230 to operate at high speed.

The ECC circuit 6223 may correspond to the ECC 138 of the controller 130 illustrated in FIG. 1. As described with reference to FIG. 1, the ECC circuit 6223 may generate an ECC (Error Correction Code) for correcting a failed bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. The ECC circuit 6223 may correct an error using the parity bit. For example, as described with reference to FIG. 1, the ECC circuit 6223 may correct an error using the LDPC code, BCH code, turbo code, Reed-Solomon code, convolution code, RSC or coded modulation such as TCM or BCM.

The memory controller 6220 may transmit receive data to/from the host 6210 through the host interface 6224. The memory controller 6220 may transmit/receive data to/from the memory device 6230 through the NVM interface 6225. The host interface 6224 may be connected to the host 6210 through a PATA bus, SATA bus, SCSI, USB, PCIe or NAND interface. The memory controller 6220 may have a wireless communication function with a mobile communication protocol such as WiFi or Long Term Evolution (LTE). The memory controller 6220 may be connected to an external device, for example, the host 6210 or another external device, and then transmit/receive data to/from the external device. In particular, as the memory controller 6220 is configured to communicate with the external device through one or more of various communication protocols, the memory system and the data processing system in accordance with an embodiment may be applied to wired/wireless electronic devices, particularly a mobile electronic device.

Figure 11:
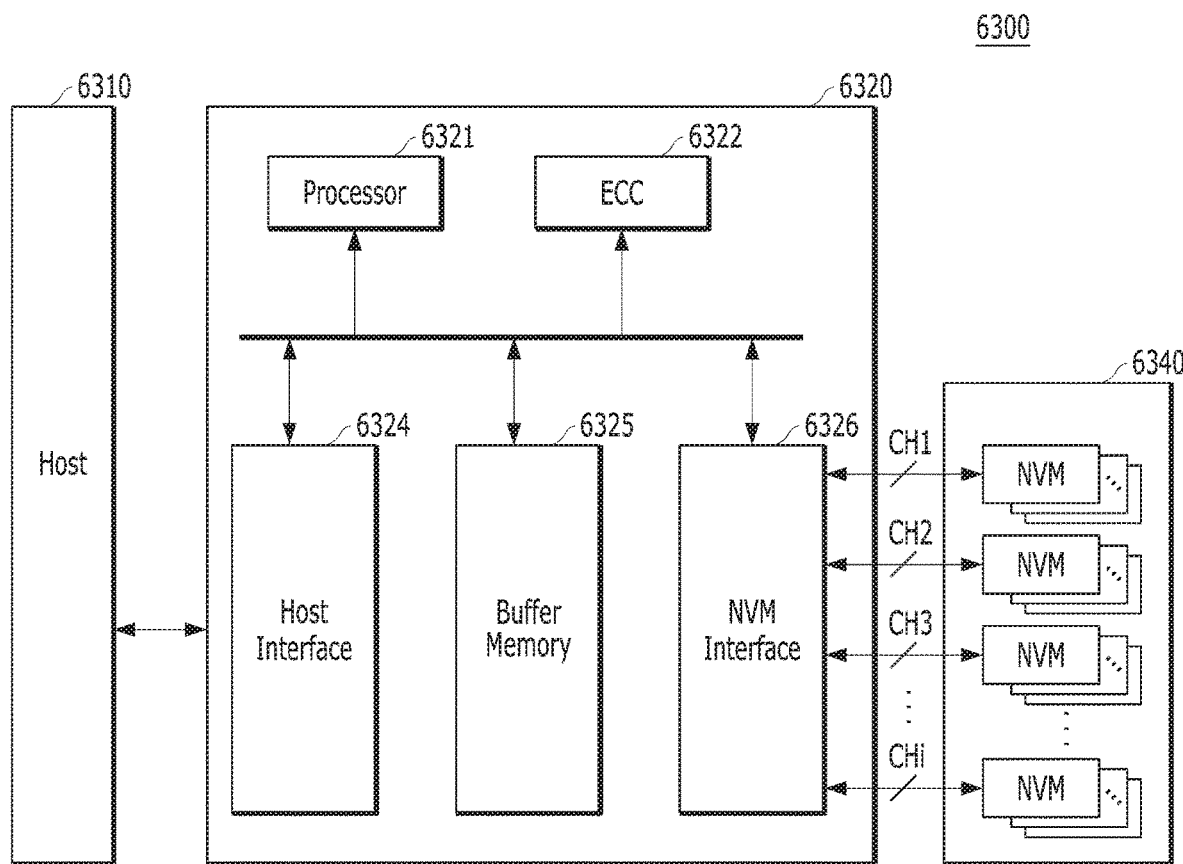

FIG. 11 is a diagram schematically illustrating another example of the data processing system including the memory system in accordance with an embodiment. FIG. 11 schematically illustrates an SSD to which the memory system is applied.

Referring to FIG. 11, the SSD 6300 may include a controller 6320 and a memory device 6340 including a plurality of nonvolatile memories. The controller 6320 may correspond to the controller 130 in the memory system 110 of FIGS. 1 to 8, and the memory device 6340 may correspond to the memory device 150 in the memory system of FIGS. 1 to 8.

More specifically, the controller 6320 may be connected to the memory device 6340 through a plurality of channels CH1 to CHi. The controller 6320 may include one or more processors 6321, a buffer memory 6325, an ECC circuit 6322, a host interface 6324 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as DRAM, SDRAM, DDR SDRAM, LPDDR SDRAM and GRAM or nonvolatile memories such as FRAM, ReRAM, STT-MRAM and PRAM. FIG. 10 illustrates that the buffer memory 6325 is disposed in the controller 6320. However, the buffer memory 6325 may be external to the controller 6320.

The ECC circuit 6322 may calculate an ECC value of data to be programmed to the memory device 6340 during a program operation. The ECC circuit 6322 may perform an error correction operation on data read from the memory device 6340 based on the ECC value during a read operation, and may perform an error correction operation on data recovered from the memory device 6340 during a failed data recovery operation.

The host interface 6324 may provide an interface function with an external device, for example, the host 6310. The nonvolatile memory interface 6326 may provide an interface function with the memory device 6340 connected through the plurality of channels.

Furthermore, a plurality of SSDs 6300 to which the memory system 110 of FIGS. 1 to 8 is applied may be provided to embody a data processing system, for example, RAID (Redundant Array of Independent Disks) system. The RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300. The RAID controller may output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300. The RAID controller may provide data read from the selected SSDs 6300 to the host 6310.

Figure 12:
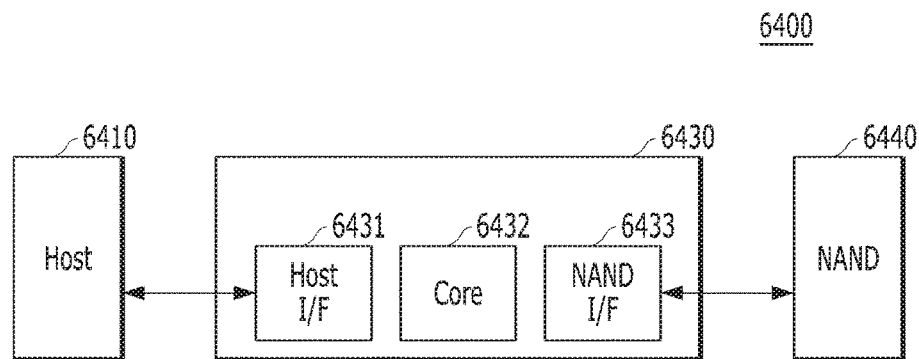

FIG. 12 is a diagram schematically illustrating another example of the data processing system including the memory system in accordance with an embodiment. FIG. 12 schematically illustrates an embedded Multi-Media Card (eMMC) to which the memory system is applied.

Referring to FIG. 12, the eMMC 6400 may include a controller 6430 and a memory device 6440 embodied by one or more NAND flash memories. The controller 6430 may correspond to the controller 130 in the memory system 110 of FIGS. 1 to 8, and the memory device 6440 may correspond to the memory device 150 in the memory system 110 of FIGS. 1 to 8.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control overall operations of the eMMC 6400. The host interface 6431 may provide an interface function between the controller 6430 and the host 6410. The NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, UHS ((Ultra High Speed)-I/UHS-II) interface.

FIGS. 13 to 16 are diagrams schematically illustrating other examples of the data processing system including the memory system in accordance with embodiments. FIGS. 13 to 16 schematically illustrate UFS (Universal Flash Storage) systems to which the memory system are applied.

Referring to FIGS. 13 to 16, the UFS systems 6500, 6600, 6700, 6800 may include hosts 6510, 6610, 6710, 6810, UFS devices 6520, 6620, 6720, 6820 and UFS cards 6530, 6630, 6730, 6830, respectively. The hosts 6510, 6610, 6710, 6810 may serve as application processors of wired/wireless electronic devices or particularly mobile electronic devices, the UFS devices 6520, 6620, 6720, 6820 may serve as embedded UFS devices, and the UFS cards 6530, 6630, 6730, 6830 may serve as external embedded UFS devices or removable UFS cards.

The hosts 6510, 6610, 6710, 6810, the UFS devices 6520, 6620, 6720, 6820 and the UFS cards 6530, 6630, 6730, 6830 in the respective UFS systems 6500, 6600, 6700, 6800 may communicate with external devices, for example, wired/wireless electronic devices or particularly mobile electronic devices through UFS protocols, and the UFS devices 6520, 6620, 6720, 6820 and the UFS cards 6530, 6630, 6730, 6830 may be embodied by the memory system 110 illustrated in FIGS. 1 to 8. For example, in the UFS systems 6500, 6600, 6700, 6800, the UFS devices 6520, 6620, 6720, 6820 may be embodied in the form of the data processing system 6200, the SSD 6300 or the eMMC 6400 described with reference to FIGS. 10 to 12, and the UFS cards 6530, 6630, 6730, 6830 may be embodied in the form of the memory card system 6100 described with reference to FIG. 9.

Furthermore, in the UFS systems 6500, 6600, 6700, 6800, the hosts 6510, 6610, 6710, 6810, the UFS devices 6520, 6620, 6720, 6820 and the UFS cards 6530, 6630, 6730, 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720, 6820 and the UFS cards 6530, 6630, 6730, 6830 may communicate with each other through various protocols other than the UFS protocol, for example, an UFDs, a MMC, a SD, a mini-SD, and a micro-SD.

Figure 13:
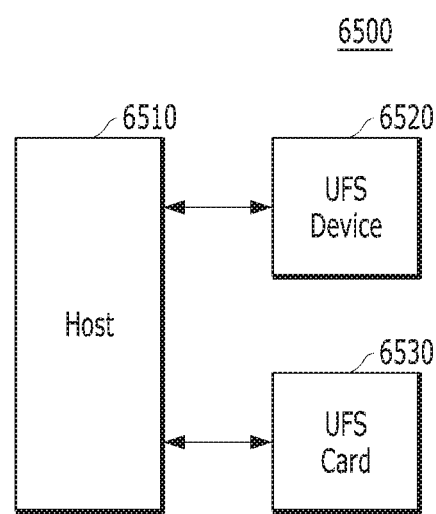

In the UFS system 6500 illustrated in FIG. 13, each of the host 6510, the UFS device 6520 and the UFS card 6530 may include UniPro. The host 6510 may perform a switching operation in order to communicate with the UFS device 6520 and the UFS card 6530. In particular, the host 6510 may communicate with the UFS device 6520 or the UFS card 6530 through link layer switching, for example, L3 switching at the UniPro. The UFS device 6520 and the UFS card 6530 may communicate with each other through link layer switching at the UniPro of the host 6510. In the present embodiment, the configuration in which one UFS device 6520 and one UFS card 6530 are connected to the host 6510 is illustrated. However, in another embodiment, a plurality of UFS devices and UFS cards may be connected in parallel or in the form of a star to the host 6410. The star form is an arrangement where a single centralized component is coupled to plural devices for parallel processing. A plurality of UFS cards may be connected in parallel or in the form of a star to the UFS device 6520 or connected in series or in the form of a chain to the UFS device 6520.

Figure 14:
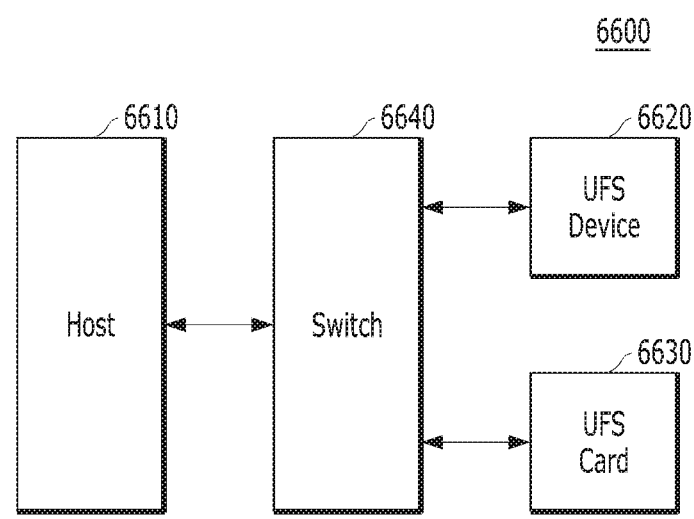

In the UFS system 6600 illustrated in FIG. 14, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In the present embodiment, the configuration in which one UFS device 6620 and one UFS card 6630 are connected to the switching module 6640 is illustrated. However, in another embodiment, a plurality of UFS devices and UFS cards may be connected in parallel or in the form of a star to the switching module 6640, and a plurality of UFS cards may be connected in series or in the form of a chain to the UFS device 6620.

Figure 15:
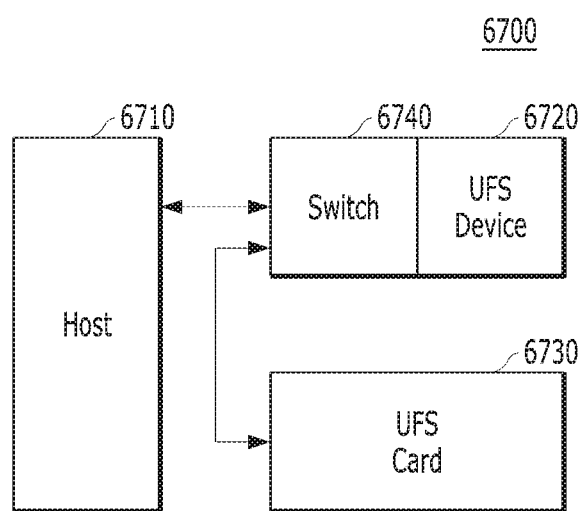

In the UFS system 6700 illustrated in FIG. 15, each of the host 6710, the UFS device 6720 and the UFS card 6730 may include UniPro, and the host 6710 may communicate with the UFS device 6720 or the UFS card 6730 through a switching module 6740 performing a switching operation, for example, through the switching module 6740 which performs link layer switching at the UniPro, for example, L3 switching. The UFS device 6720 and the UFS card 6730 may communicate with each other through link layer switching of the switching module 6740 at the UniPro, and the switching module 6740 may be integrated as one module with the UFS device 6720 inside or outside the UFS device 6720. In the present embodiment, the configuration in which one UFS device 6720 and one UFS card 6730 are connected to the switching module 6740 is illustrated. However, in another embodiment, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 16:
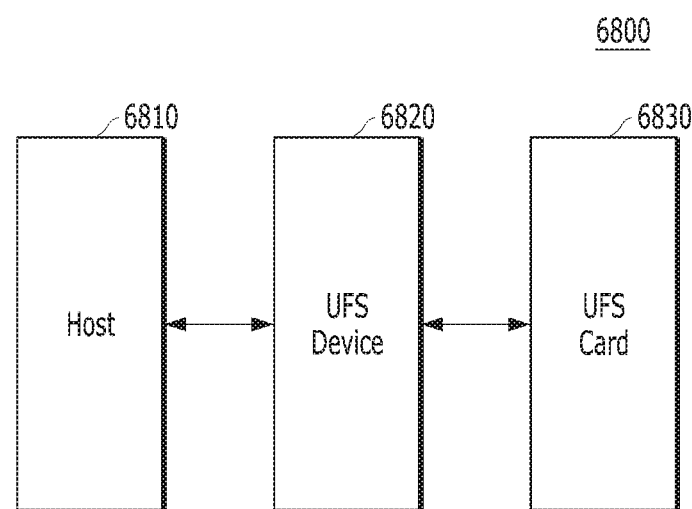

In the UFS system 6800 illustrated in FIG. 16, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target ID (Identifier) switching operation. The host 6810 and the UFS card 6830 may communicate with each other through target ID switching between the M-PHY and UniPro modules of the UFS device 6820. In the present embodiment, the configuration in which one UFS device 6820 is connected to the host 6810 and one UFS card 6830 is connected to the UFS device 6820 is illustrated. However, in another embodiment, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 17:
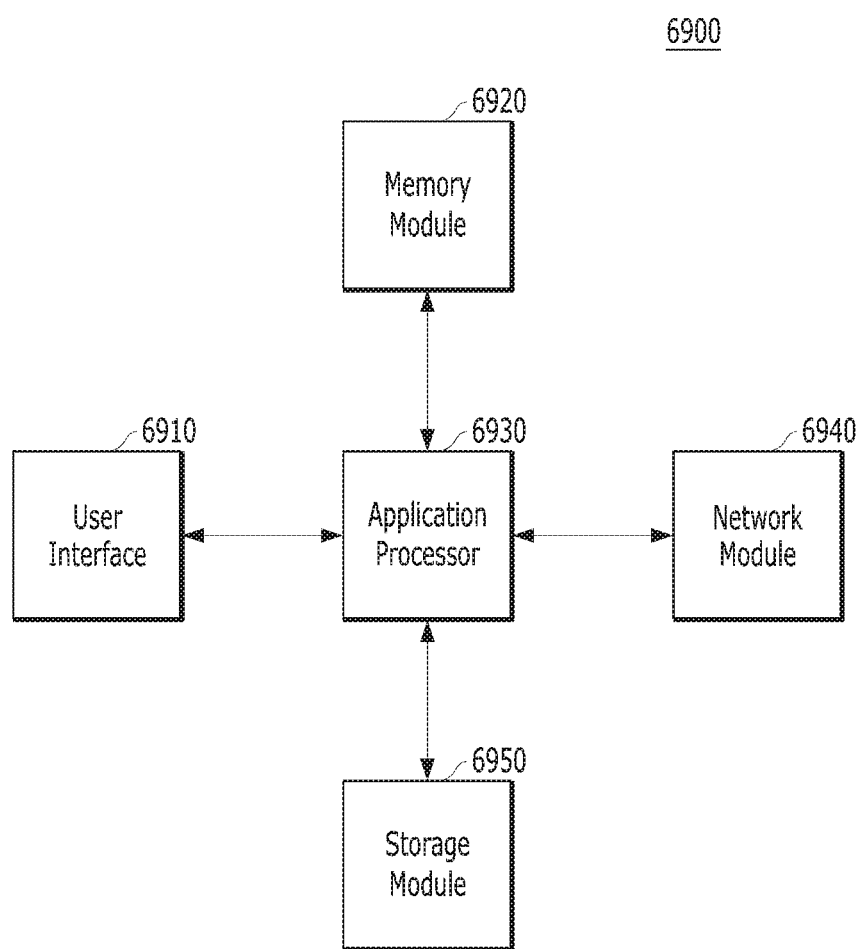

FIG. 17 is a diagram schematically illustrating another example of the data processing system including the memory system in accordance with an embodiment. FIG. 17 is a diagram schematically illustrating a user system to which the memory system is applied.

Referring to FIG. 17, the user system 6900 may include an application processor 6930, a memory module 6920, a network module 6940, a storage module 6950 and a user interface 6910.

More specifically, the application processor 6930 may drive components included in the user system 6900, for example, an OS, and include controllers, interfaces and a graphic engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile RAM such as DRAM, SDRAM, DDR SDRAM, DDR2 SDRAM, DDR3 SDRAM, LPDDR SDARM, LPDDR3 SDRAM or LPDDR3 SDRAM or a nonvolatile RAM such as PRAM, ReRAM, MRAM or FRAM. For example, the application is processor 6930 and the memory module 6920 may be packaged and mounted, based on POP (Package on Package).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices, particularly mobile electronic devices. Therefore, the memory system and the data processing system, in accordance with an embodiment of the present disclosure, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, a NOR flash and a 3D NAND flash, and provided as a removable storage medium such as a memory card or external drive of the user system 6900. The storage module 6950 may correspond to the memory system 110 described with reference to FIGS. 1 to 8. Furthermore, the storage module 6950 may be embodied as an SSD, an eMMC and an UFS as described above with reference to FIGS. 11 to 16.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIGS. 1 to 8 is applied to a mobile electronic device of the user system 6900, the application processor 6930 may control overall operations of the mobile electronic device. The network module 6940 may serve as a communication module for controlling wired/wireless communication with an external device. The user interface 6910 may display data processed by the processor 6930 on a display/touch module of the mobile electronic device. Further, the user interface 6910 may support a function of receiving data from the touch panel.

The memory system and the operating method thereof according to embodiments may reduce or minimize complexity and performance deterioration of the memory system and enhance or maximize use efficiency of a memory device, thereby quickly and stably process data with respect to the memory device.

Although various embodiments have been described and illustrated, it will be apparent to those skilled in the art that various changes and modifications may be made without departing from the spirit and scope of the disclosure as defined in the following claims.

What is claimed is:

1. A memory system comprising:
a memory device storing data and including a memory interface in communication with a memory controller; and
the memory controller controlling the memory device and including a controller interface in communication with the memory device,
wherein, when the memory controller fails to access the memory device, the memory controller requests current state information including a current operation mode of the memory interface from the memory device, and changes an operation mode of the controller interface to match the current operation mode of the memory interface according to the current state information received from the memory device, and
wherein the current state information further includes at least one of information about whether a reset of the memory device is needed and information about whether a Content Addressable Memory (CAM) read of the memory device is needed.

2. The memory system according to claim 1, wherein each of the memory interface and the controller interface operates in a Double Data Rate (DDR) mode or a Single Data Rate (SDR) mode.

3. The memory system according to claim 1, wherein the memory controller requests the current state information using a current state request signal which maintains a specific logical value for a first time period after being activated.

4. The memory system according to claim 3, wherein the current state request signal includes a read enable signal.

5. The memory system according to claim 3, wherein the memory device monitors the current state request signal and outputs the current state information upon elapse of the first time period.

6. The memory system according to claim 5, wherein the memory device outputs the current state information until the current state request signal becomes inactive or for a second time period from elapse of the first time period.

7. The memory system according to claim 1, wherein the memory device outputs the current state information using a data signal.

8. The memory system according to claim 1, wherein the current state information includes a data structure including a bit having a logical high value or a logical low value indicative of an operation mode of the memory interface.

9. The memory system according to claim 1, wherein the memory controller outputs at least one of a reset command and a CAM read command to the memory device according to the current state information.

10. The memory system according to claim 1, wherein the current state information includes a data structure including at least one of a bit having a logical high value or a logical low value indicative of whether the reset of the memory device is needed and a bit having a logical high value or a logical low value indicative of whether the CAM read of the memory device is needed.

11. A memory controller comprising:
a controller interface for communication with a memory interface of a memory device; and
a controller processor,
wherein, when the memory controller fails to access the memory device, the memory controller requests current state information including a current operation mode of memory interface of the memory device from the memory device, and changes an operation mode of the first controller interface to match the current operation mode of the memory interface according to the current state information received from the memory device, and
wherein the current state information further includes at least one of information about whether a reset of the memory device is needed and information about whether a Content Addressable Memory (CAM) read of the memory device is needed.

12. The memory controller according to claim 11, wherein each of the controller interface and the memory interface operates in a Double Data Rate (DDR) mode or a Single Data Rate (SDR) mode.

13. The memory controller according to claim 11, wherein the processor requests the current state information using a current state request signal which maintains a specific logical value for a first time period after being activated.

14. The memory controller according to claim 13, wherein the current state request signal includes a read enable signal.

15. The memory controller according to claim 11, wherein the processor outputs at least one of a reset command and a CAM read command to the memory device according to the current state information.

16. A memory device comprising:
an interface for communication with a memory controller; and
a processor,
wherein, in response to a request of current state information from the memory controller, the processor outputs the current state information regarding a current operation mode of the interface to the memory controller, and
wherein the current state information further includes at least one of information about whether a reset of the memory device is needed and information about whether a Content Addressable Memory (CAM) read of the memory device is needed.

17. The memory device according to claim 16, wherein the interface operates in a Double Data Rate (DDR) mode or a Single Data Rate (SDR) mode.

18. The memory device according to claim 16, wherein the request of the current state information is performed using a current state request signal which maintains a specific logical value for a first time period after being activated, and
the processor monitors the current state request signal and outputs the current state information upon elapse of the first time period.

19. A memory system, comprising:
a memory device configured to operate in any of a plurality of operation modes, the memory device including cells storing data, and a memory interface configured to have any of a plurality of interface states respectively enabling the plurality of operation modes of the memory device; and
a memory controller configured to operate in any of the plurality of operation modes, the memory controller including a controller interface, in communication with the memory interface, configured to have any of the plurality of interface states respectively enabling the plurality of operation modes of the memory controller;
wherein the memory controller requests information including a current state of the memory interface from the memory device when the memory controller fails to access the memory device, the memory device sends the requested information to the memory controller, and the memory controller changes a current interface state of the controller interface based on the information, and
wherein the memory device information further includes at least one of information about whether a reset of the memory device is needed and information about whether a Content Addressable Memory (CAM) read of the memory device is needed.

* * * * *